United States Patent
Ford

(10) Patent No.: US 6,774,299 B2
(45) Date of Patent: Aug. 10, 2004

(54) SOLAR ELECTRIC ALTERNATING CURRENT GENERATOR

(76) Inventor: Jorge Ford, 939 Lexington St., Apt. 3, El Cerrito, CA (US) 94530

(*) Notice: Subject to any disclaimer, the term of this patent is extended or adjusted under 35 U.S.C. 154(b) by 0 days.

(21) Appl. No.: 10/222,482

(22) Filed: Aug. 16, 2002

(65) Prior Publication Data

US 2004/0031516 A1 Feb. 19, 2004

(51) Int. Cl.[7] ............ H01L 31/042; H01L 31/05; H01L 31/052
(52) U.S. Cl. ............ 136/244; 136/246; 136/248; 136/291; 136/293; 310/300; 310/303; 320/101; 323/906
(58) Field of Search ............ 136/244, 246, 136/248, 291, 293; 310/300, 303; 320/101; 323/906

(56) References Cited

U.S. PATENT DOCUMENTS

| | | |
|---|---|---|
| 4,061,926 A | 12/1977 | Peed |
| 4,119,863 A | 10/1978 | Kelly |
| 4,213,057 A | 7/1980 | Are |
| 4,217,633 A | 8/1980 | Evans, Jr. |
| 4,321,416 A | 3/1982 | Tennant |
| 4,345,161 A | 8/1982 | Crompton |
| 4,577,052 A | 3/1986 | Schutten et al. |
| 4,614,879 A | 9/1986 | Ault |
| 4,751,413 A | 6/1988 | Izawa |
| 4,908,540 A | 3/1990 | Motodate et al. |
| 5,898,585 A | 4/1999 | Sirichote et al. |
| 6,013,870 A | 1/2000 | Psyk et al. |
| 6,031,177 A | 2/2000 | Voss |
| 6,111,767 A | 8/2000 | Handleman |
| 6,124,545 A | 9/2000 | Bauer et al. |
| 6,201,181 B1 | 3/2001 | Azzam et al. |
| 6,316,716 B1 | 11/2001 | Hilgrath |

FOREIGN PATENT DOCUMENTS

| | | | |
|---|---|---|---|
| DE | 3521216 A1 | * | 5/1986 |
| JP | 60-223931 A | * | 11/1985 |
| JP | 61-203836 A | * | 9/1986 |
| JP | 6-167269 A | * | 6/1994 |
| JP | 11-125171 A | * | 5/1999 |
| JP | 2001-73926 A | * | 3/2001 |

* cited by examiner

Primary Examiner—Alan Diamond
(74) Attorney, Agent, or Firm—Burns, Doane, Swecker & Mathis, LLP

(57) ABSTRACT

A device consisting of solar photovoltaic cells, a solar activated dc motor, contact brushes and wiring to transfer the electric current to the applied load. The cells are mounted on vanes attached to a central shaft that is made to rotate by the dc motor. The electrical output of the photovoltaic cells is transferred by means of brushes to a stationary contact points wired to the applied load. The device exhibits phase behavior and produces a varying electrical output. By wiring the stationary contact points opposite each other, the output produced is AC electricity. When both ends are wired in the same direction the output is fluctuating do current similar to pulsating DC. The electricity generated can be put through a transformer.

14 Claims, 4 Drawing Sheets

SOLAR ELECTRIC ALTERNATING CURRENT GENERATOR

FIELD OF THE INVENTION

The invention is directed to a compact device for generating alternating current using solar energy.

BACKGROUND OF THE INVENTION

Present solar generators employ photovoltaic cells that are connected to generate direct current (DC) electricity. For example, U.S. Pat. No. 4,614,879 describes a photovoltaic panel for converting solar energy into electrical energy output having a desired voltage and current and which is connected to a load. Typically, as described in U.S. Pat. No. 4,321,416 solar generator systems comprise an array of photovoltaic cells or modules that are connected in particular series-parallel circuited arrangements to achieved the desired outputs. The DC output can be converted into alternating current (AC) by passing the DC through an inverter such as in the apparatus described in U.S. Pat. No. 4,217,633. Other AC solar generators employ pairs of PN junction solar cells that are connected in antiparallel and a means for directing light alternatively to the PN junctions. (See U.S. Pat. No. 4,577,052.)

Despite the many advances in AC solar generators such prior art systems exhibit a number of limitations. For one thing, a typical panel produces only approximately 5 to 6 watts per square foot of coverage, which means that extensive surface areas are required to generate enough power for many applications. In addition, standard DC electrical outputs cannot be transformed and therefore cannot be transmitted long distances from the place of generation. Rather, the DC output must first be converted to AC before being put through a transformer to be transported long distances or to be put into the existing electric grid. Finally, a photovoltaic cell's energy generating capacity depends on its orientation to the sun.

SUMMARY OF THE INVENTION

The present invention is directed to a portable device that generates AC electric energy. The device includes a plurality of solar panels that are attached to vanes that are mounted on a rotating shaft that is actuated by a DC motor. As the panels rotate a fluctuating, or alternating, voltage is developed. The output voltage and current vary in a sinusoidal waveform of the light intensity incident on each panel. Specifically, by rotating each vane, the intensity of incident radiation on the panel varies sinusoidally, thereby developing a sinusoidal electrical voltage and current output.

DESCRIPTION OF THE PREFERRED EMBODIMENTS

Figure 1:
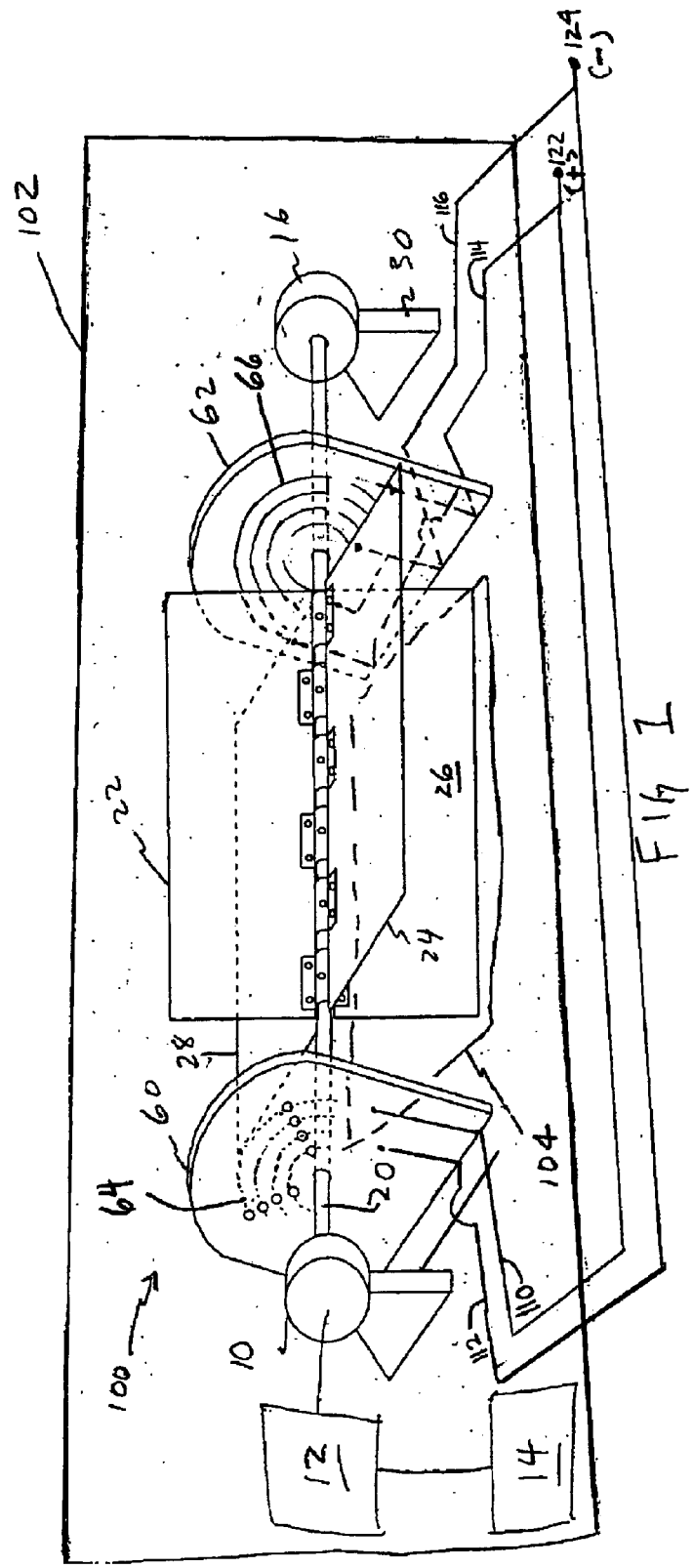
FIG. 1 is a schematic of the solar electric AC generator.

Referring to FIG. 1, the solar alternating current generator 100 includes an actuator 10 which is typically a DC motor that is powered by a battery 12 which in turn can be charged by a solar panel 14. Motor 10 is attached to shaft 20 onto unto which a set of vanes 22, 24, 26, and 28 is attached. The number and configuration of the vanes in each set can vary from one to five or more; two to four vanes are preferred. The configuration of each vane is not critical. The other end of the shaft 20 is connected to a roller bearing ring 16 of shaft support 30. As is apparent, additional shaft supports with roller bearing rings can be employed if the shaft is very long and/or additional sets of vanes are employed. FIG. 1 illustrates an embodiment in which only one set of vanes is employed, however, it is understood that multiple sets that are preferably positioned in tandem, can be employed. For example, in one embodiment, multiple sets of vanes each set apart from the next and positioned in tandem along a shaft are employed. In this design, intermediate shaft supports with roller bearing rings can be positioned between adjacent sets of vanes to minimize friction and to support the weight of the shaft and vanes.

Each vane preferably comprises a flat member that is made of a durable, light weight material such as, for example, aluminum, carbon fiber, fiberglass, or plastic. FIG. 1 illustrates an embodiment with 4 vanes that are 90 degrees apart and the vanes are secured to a solid shaft. Although more than 4 vanes can be used, expanding the number of vanes increases the likelihood that solar radiation will be partially or fully intercepted by an adjacent vane before the radiation reaches photovoltaic cells that are attached to a particular vane surface.

Figure 2:
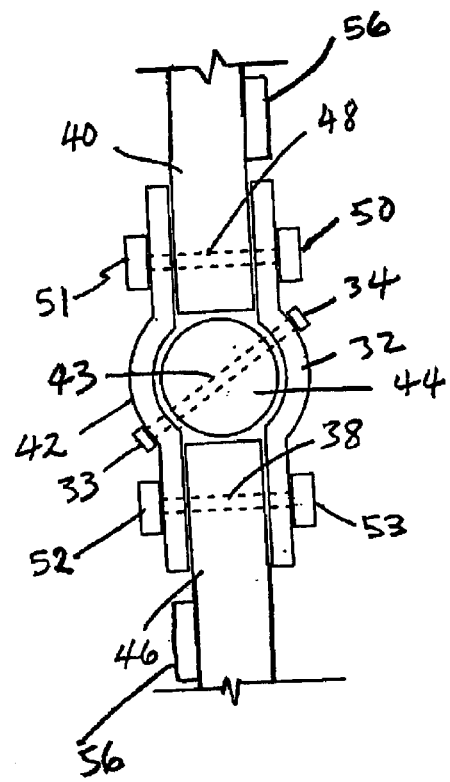
FIG. 2 illustrates the attachment of the vanes to the shaft of the generator.

FIG. 2 is a partial cross sectional view showing two vanes 40 and 46 that are clamped onto solid shaft 44. Clamp collars 32, 42 are positioned on opposite sides of shaft 44; the curved contour of the inner surface of each collar matches the round outer surface of the shaft. The collars are secured to the shaft by nuts 33, 34 and bolt 43. Vane 40 is secured between collars 32 and 42 by nuts 50, 51, and bolt 48; similarly, vane 46 is secured between the collars by nuts 52, 53 and bolt 38. One or more solar or photovoltaic cells 56 are attached to the outer surfaces of the vanes.

The term "solar cell" or "photovoltaic cell" is meant to encompass any photovoltaic device or photoelectric transducer that converts solar light energy into DC. Typical solar cells are semiconductor devices. Solar cells are commercially available and are typically packaged as an array or panel of solar cells that are electrically coupled to provide a specified current and voltage outputs depending on the solar radiation intensity. Suitable solar cells are available from ASE Americas, Inc. (Billerica, Mass.). Flexible solar modules that comprise photovoltaic cells adhered onto polymer substrates are available from Iowa Thin Film Technologies, Inc. (Boone, Iowa).

Figure 3:
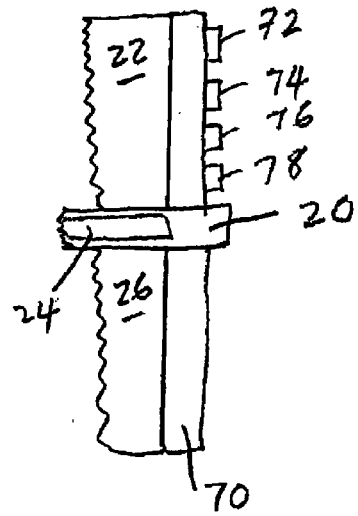

FIG. 3 is a partial side view of the right edges of the vanes wherein vanes 22, 24, and 26 are shown. Vane 28 of FIG. 1 (not shown) is positioned opposite vane 24. As shown, a positive rotating plate 70 is attached to the edges of the vanes. The rotating plate 70 is made of a non-electrically conducting material (i.e. insulative) such as plastic and the rotating plate 70 rotates as shaft 20 is rotated. Mounted on the outer surface of the rotating plate 70 are four contact electric brushes 72, 74, 76, and 78.

Figure 4:
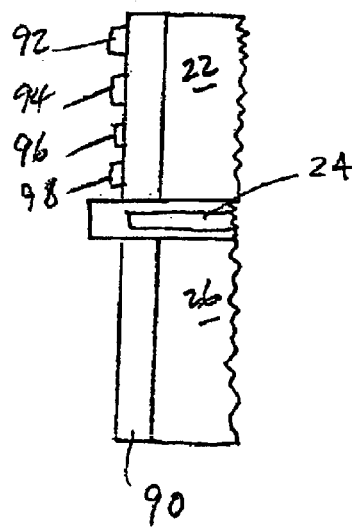
FIGS. 3 and 4 illustrate the attachment of the rotating plates, which include electric contact brushes, onto the edges of the vanes.

Similarly, FIG. 4 is a partial side view of the left edges of the vanes wherein vanes 22, 24, and 26 are shown; vane 28 of FIG. 1 (not shown) is positioned opposite vane 24. In addition, a negative rotating plate 90 is attached to the edges of the vanes. The rotating negative plate 90 is made of an electrically insulative material and it rotates as shaft 20 is rotated. Mounted on the outer surface of the rotating plate 90 are four contact electric brushes 92, 94, 96, and 98.

Figure 7:
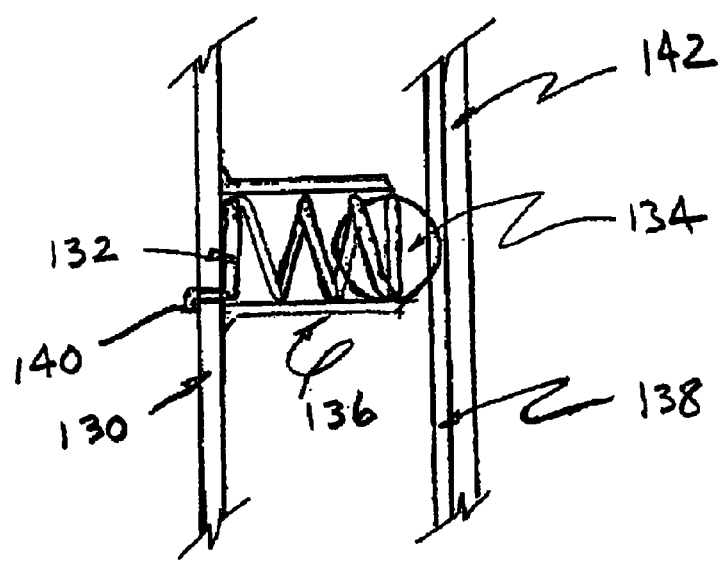
FIG. 7 is a cross sectional view of an electric contact device with a point contact.

Instead of using brushes, each electric contact can comprise a spring loaded electric contact point device to electrically connect the photovoltaic cells on the vanes to metal strips located on contacts plates. As shown in FIG. 7, attached to rotating plate 130 is a metal spring 132 that has a metal sphere 134 within the spiral at the distal end of the spring. The proximal end 140 of the spring functions as an electric connector to the photovoltaic cell input (positive or negative terminal), which is further described herein. Both the spring and sphere are constructed of electrically conductive metals or alloys such as steel. Spring 132 is secured in place with sleeve 136 with is made of an electrically insulating material such as hard plastic. The metal sphere is in contact with metal rail or strip 138 which is attached to stationary contact plate 142, which are further described herein. The metal sphere will rotate about its own axis as the rotating plate turns; the movement of the sphere will reduce the static friction load on the motor shaft. The spring acts as a shock absorber and helps maintain a constant pressure on the sphere thereby facilitating continuous electrical contact to the strip.

Each of the solar panels on vanes 22, 24, 26, and 28 has a positive terminal and a negative terminal that are electrically connected to a contact electric brush or point on the positive and negative rotating plates, respectively. Thus, each of the four solar panels corresponding to the four vanes is electrically connected to individual positive and negative brushes. As an example, the positive and negative terminals of the array of solar cells on vane 22 can be connected to contact electric brushes 72 and 92, respectively. The positive and negative terminals for the other three arrays on vanes 24, 26, and 28 are similarly connected to the appropriate brushes.

Figure 5:
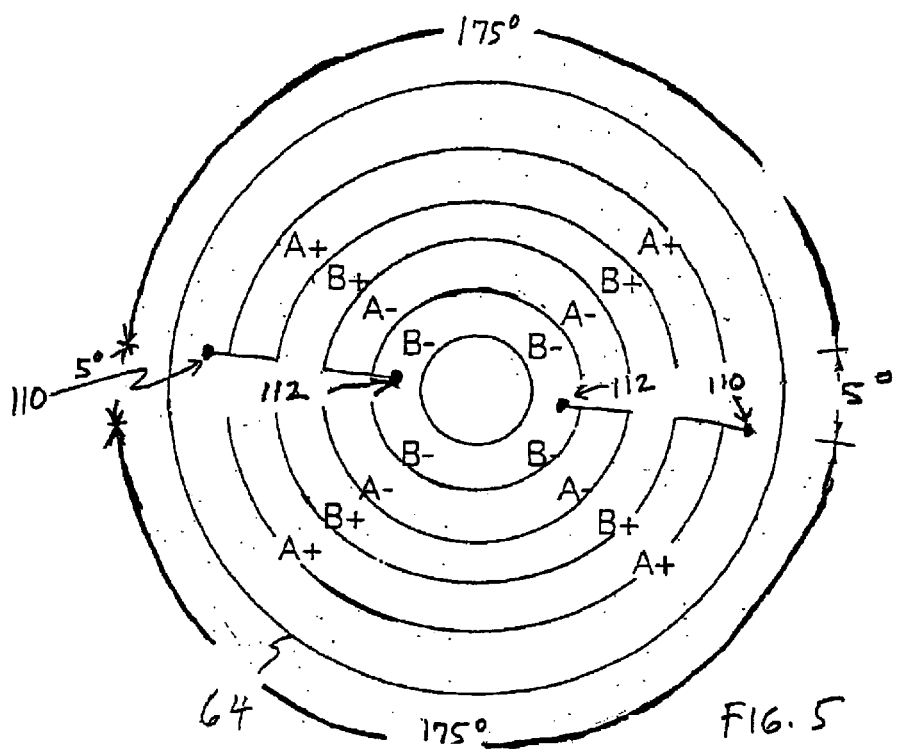
FIGS. 5 and 6 illustrate stationary contact plates.
Figure 6:
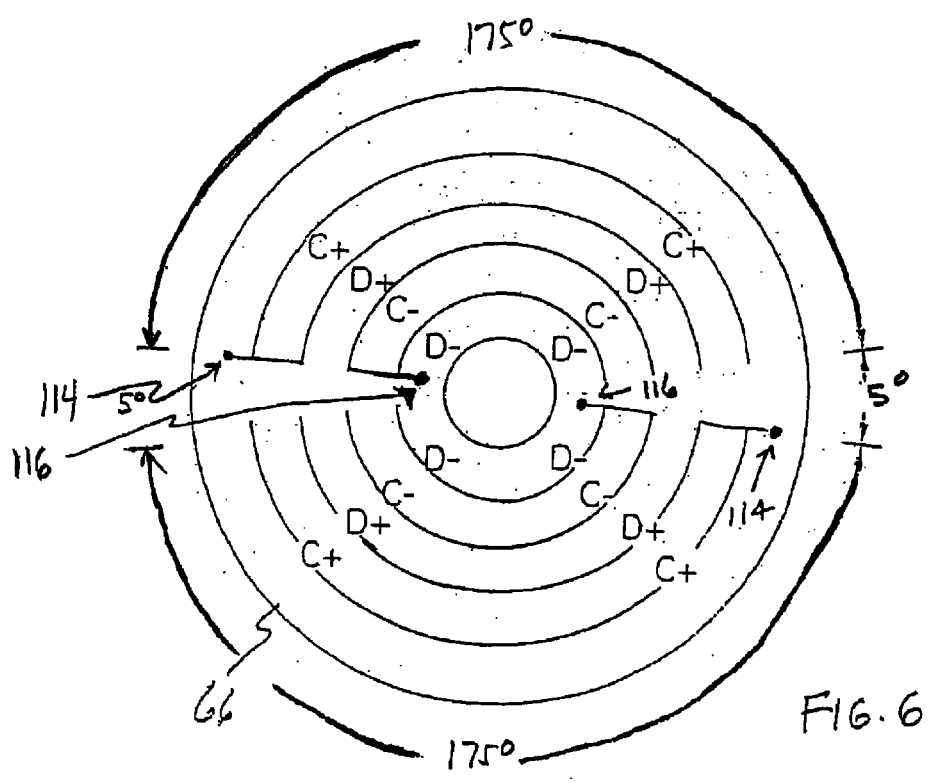

As further shown in FIG. 1, the solar AC generator also includes frames 60 and 62 which border the right and left edges of the vanes. Mounted on the inner side of frame 60 that faces the vanes is stationary contact plate 64 and mounted on the side of the frame 62 that faces the vanes is stationary contact plate 66. FIGS. 5 and 6 depict the inner surfaces (facing the vanes) of plates 64 and 66, respectively. As shown in FIG. 5, the inner surface of contact plate 64 is embedded with four arc-shaped metal strips labeled A+, B+, A− and B−. Similarly, as shown in FIG. 5, the inner surface of contact plate 66 is embedded with four sets arc-shaped metal strips labeled C+, D+, C− and D−.

Designating the four vanes 22, 24, 26, and 28 as vanes A, B, C, and D, respectively, in a preferred embodiment the positive terminal and negative terminal of the array of solar cells attached to vane A are connected to metal strips A+ and A−, respectively. The positive and negative terminals of the arrays attached to vanes B, C, and D are also similarly connected to the appropriate metal strips. As shown in FIG. 5, the positive metal strips and negative metal strips in turn are connected to leads 110 and 112, respectively. Similarly, as shown in FIG. 6, the positive metal strips and negative metal strips in turn are connected to leads 114 and 116, respectively. As depicted in FIG. 1, positive leads 110 and 114 are connected to form terminal 122 and negative leads 112 and 116 are connected to form terminal 124. Terminals 122 and 124 can be connected directly to any device or load that operates on AC.

To provide protection from the elements, e.g., wind and rain, the solar electric AC generator 100 is preferably enclosed within a transparent protective housing 102 as shown in FIG. 1. Rigid plastic such as acrylic can be used. In addition, a reflective material or mirror 104 can be positioned on the base of the housing under the vane. The reflected radiation is captured by solar cells of the AC generator thereby increasing the efficiency of the AC generator. Because the position of the sun relative to the AC generator changes during the course of the day, the intensity of incident radiation on the panels will also fluctuate. However, the mirror will decrease the level of fluctuation.

In operation, motor 10 is initially activated with battery 12 to rotate the vanes of the solar AC generating device as shown in FIG. 1. As the array of solar cells in the vanes convert radiation initially into DC, the device provides a current and voltage with a phase behavior which when put through a transformer allows for the generation of the required magnetic flux necessary to transform input current and voltage. Typically, the frequency and magnitude of the power generated are directly proportional to the rotating or angular velocity of the vane. In a preferred embodiment, the solar cells that are mounted on the vanes generated a current (I) output that is in accordance with the following expressions:

$I = C dV/dt$, where $dV/dt = V\omega \cos\omega t$ and C=capacitance; and (i)

$P = NIV$, where P=power, N=number of cells, V=generated voltage, and $\omega$=rotating (angular) velocity of the vane.

As is apparent, the rotating vanes produce a current that fluctuates at a certain frequency. The current is transmitted from the positive contact of the array of cells at the edge of a vane to its corresponding brush on the rotating plate. The current is transmitted from the brush to the metal strips.

The generated AC electricity can also be fed directly to a transformer or into the power grid. Since the power grid is a 60 Hz system, the solar AC generating device has to generate 60 Hz electricity. In order to do so, the shaft speed of the device would have to be 60 Hz/N, wherein N is the number of panels. Since the number of panels that can be packed onto the shaft in any axial portion is limited, the shaft speed would need to be relatively high. For example, if N is 4, then the shaft would need to rotate 15 times per second. Furthermore, a solar panel may need to be illuminated under a steady state condition prior to its developing its full output, i.e., a rise time. A fast rotation may exceed this rise time. This would result in a steady phase shift of the output waveform during the day. The power grid must be frequency stable, requiring very low tolerance for frequency and phase shifts. Because the solar cells are rotating the orientation to the sun rays will hit a maximum at the point where the sun rays fall at 90 degrees (zenith for device) and a minimum at the opposite side (nadir for the device).

The device can preferably be wired in two different configurations: (i) one to provide fluctuating (sinusoidal current and voltage) DC, with current going in one direction only and (ii) a second configuration to provide AC, with current cycling in opposite directions.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A solar electric generator comprising:
   a rotatable member having at least one vane attached thereto wherein the vane has at least one photovoltaic cell mounted thereon, the at least one photovoltaic cell being adapted to be exposed to light generating an electric output; and means for rotating the rotatable member relative to the light so as to vary the exposure of the rotatable member to light during rotation; and a connection device configured to obtain from the at least one photovoltaic cell an electric output exhibiting phase behavior and having a frequency and magnitude which vary with angular velocity, said electric output being characteristic of an AC output having current cycling in opposite directions.

2. The solar electric generator of claim 1 wherein the generator produces a sinusoidally fluctuating current or voltage.

3. The solar electric generator of claim 1 wherein the electric output from the at least one photovoltaic cell is connected to a transformer.

4. The solar electric generator of claim 1 wherein the means for rotating the rotatable member comprises a battery driven motor.

5. The solar electric generator of claim 4 wherein the battery is recharged by a second photovoltaic cell.

6. The solar electric generator of claim 1 wherein 2 to 4 vanes are attached to the rotatable member wherein each vane has at least one photovoltaic cell mounted thereon.

7. The solar electric generator of claim 1 wherein the rotatable member is positioned on a material that reflects solar radiation.

8. A solar electric generator comprising:

a rotatable member having at least one vane attached thereto wherein the vane has at least one photovoltaic cell mounted thereon, the at least one photovoltaic cell being adapted to be exposed to light generating an electric output; and means for rotating the rotatable member, wherein the rotatable member is positioned on a material that reflects solar radiation.

9. A solar electric generator comprising:

a rotatable member having at least one vane attached thereto wherein the vane has at least one photovoltaic cell counted thereon, the at least one photovoltaic cell being adapted to be exposed to light and generating an electric output;

an actuator which motivates rotation of the rotatable member relative to the light so as to vary the exposure of the rotatable member to light during rotation; and a connection device configured to obtain from the at least one photovoltaic cell an electric output exhibiting phase behavior and having a frequency and magnitude which vary with angular velocity, said electric output being characteristic of an AC output having current cycling in opposite directions.

10. The solar electric generator of claim 9 wherein the generator produces a sinusoidally fluctuating current or voltage.

11. The solar electric generator of claim 9 wherein the electric output from the at least one photovoltaic cell is connected to a transformer.

12. The solar electric generator of claim 9 wherein the actuator comprises an electric motor.

13. The solar electric generator of claim 9 wherein the electric motor is battery driven and said battery is recharged by a second photovoltaic cell.

14. The solar electric generator of claim 9 wherein 2 to 4 vanes are attached to the rotatable member wherein each vane has at least one photovoltaic cell mounted thereon.

* * * * *